(12) United States Patent
Kim et al.

(10) Patent No.: US 6,806,096 B1
(45) Date of Patent: Oct. 19, 2004

(54) INTEGRATION SCHEME FOR AVOIDING PLASMA DAMAGE IN MRAM TECHNOLOGY

(75) Inventors: Woosik Kim, Wappingers Falls, NY (US); Gill Yong Lee, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/464,226

(22) Filed: Jun. 18, 2003

(51) Int. Cl.$^7$ ............................................. H01L 21/00
(52) U.S. Cl. .................................................... 438/3
(58) Field of Search ......................... 438/3, 240, 244, 438/250, 253, 254; 257/295, 303, 306, 310

(56) References Cited

U.S. PATENT DOCUMENTS

| | | | | |
|---|---|---|---|---|
| 6,153,443 A | * | 11/2000 | Durlam et al. | ................. 438/3 |
| 6,713,802 B1 | * | 3/2004 | Lee | ............................ 257/295 |
| 6,723,598 B2 | * | 4/2004 | Lim et al. | ................... 438/240 |
| 6,734,079 B2 | * | 5/2004 | Huang et al. | ............... 438/396 |

* cited by examiner

*Primary Examiner*—Hung Vu
(74) *Attorney, Agent, or Firm*—Slater & Matsil, L.L.P.

(57) ABSTRACT

A method of fabricating a magnetic memory device and a magnetic memory device structure. A buffer insulating layer is deposited over the top surface of the conductive hard mask of a magnetic memory cell. The buffer insulating layer is left remaining over the conductive hard mask top surface while the various material layers of the device are patterned and etched. The buffer insulating layer prevents the conductive hard mask top surface from being damaged during plasma-containing processes.

23 Claims, 7 Drawing Sheets

INTEGRATION SCHEME FOR AVOIDING PLASMA DAMAGE IN MRAM TECHNOLOGY

TECHNICAL FIELD

The present invention relates generally to the fabrication of semiconductor devices, and more particularly to the fabrication of magnetic random access memory (MRAM) devices.

BACKGROUND

A more recent development in semiconductor memory devices involves spin electronics, which combines semiconductor technology and magnetics. The spin of an electron, rather than the charge, is used to indicate the presence of a "1" or "0". One such spin electronic device is an MRAM device, which includes conductive lines positioned in a different direction, e.g., pendicular to one another in different metal layers, the conductive lines sandwiching a magnetic stack or magnetic tunnel junction (MTJ), which functions as a magnetic memory cell. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is storable in the alignment of magnetic moments. The resistance of the magnetic memory cell depends on the moment's alignment. The stored state is read from the magnetic memory cell by detecting the component's resistive state.

An advantage of MRAMs compared to traditional semiconductor memory devices such as dynamic random access memory devices (DRAMs) is that MRAMs are non-volatile. For example, a personal computer (PC) utilizing MRAMs would not have a long "boot-up" time as with conventional PCs that utilize DRAMs. Also, an MRAM does not need to be powered up and has the capability of "remembering" the stored data. Therefore, MRAM devices are replacing flash memory, DRAM and static random access memory devices (SRAM) devices in electronic applications where a memory device is needed.

A magnetic stack comprises many different layers of metals and magnetic metals, and a thin layer of dielectric material having a total thickness of a few tens of nanometers. The magnetic stacks are typically built on top of copper wires embedded in an inter-level dielectric (ILD) material. The MTJ's are positioned at intersections of underlying first conductive lines and overlying second conductive lines. MRAM devices are typically manufactured by forming a plurality of magnetic metal stacks arranged in an array, which comprise the magnetic memory cells. A memory cell array typically has conductive lines in a matrix structure having rows and columns.

One type of MRAM array uses a transistor to select each magnetic memory cell. Another type, a cross-point array, comprises an array of magnetic bits or magnetic stacks situated at the cross-points between two conductive lines. Information is stored in one of the magnetic layers of the magnetic stacks. To store the information, a magnetic field is necessary. In a crosspoint array, this magnetic field is provided by a wordline and bitline current which is passed through conductive lines. Information is stored in the magnetic memory cells by aligning the magnetization of one ferromagnetic layer (the information layer or free layer) either parallel or antiparallel to a second magnetic layer (the reference layer or fixed layer). The information is detectable due to the fact that the resistance of the element in the parallel case is different from the antiparallel case. Magnetic stacks or memory cells in a cross-point array are usually selected by passing sub-threshold currents through the conductive lines, e.g., in both the x- and y-direction, and where the conductive lines cross at the cross-points, the combined magnetic field is large enough to change the magnetic orientation.

A critical challenge in MRAM technology is the patterning of the MTJ stack material, and the conductive and insulating layers proximate the MTJ stack material, without damaging the MTJ stack material. In particular, it important to avoid damage to the upper conductive layers of the MTJ stack, to avoid damaging the memory device.

Plasma is an electrically charged or ionized gas that is often used for etching semiconductor materials. Plasma is also used to strip photoresist from over semiconductor material layers. The thin magnetic and conductive layers used in the MTJ stack are easily damaged during plasma etch processes and photoresist removal. Plasma has a negative charging effect on conductive materials, which can detrimentally impact device performance. Thus, what is needed in the art is a processing scheme for manufacturing a magnetic memory device that prevents exposure of the magnetic memory cell to plasma processes.

SUMMARY OF THE INVENTION

These and other problems are generally solved or circumvented, and technical advantages are generally achieved, by preferred embodiments of the present invention, which provide a novel integration scheme for avoiding damage to MTJ material layers due to exposure to plasma processes. A buffer insulating layer and an etch stop material are deposited over the conductive hard mask of the MTJ stack after the MTJ stack is patterned. The buffer insulating layer protects the MTJ stack and conductive hard mask material during the patterning of subsequently formed conductive lines that make electrical contact to the conductive hard mask, and also during photoresist strip.

In accordance with a preferred embodiment of the present invention, a method of fabricating a magnetic memory device includes providing a workpiece having a plurality of first conductive lines formed thereon, a bottom electrode material being disposed over and abutting at least one first conductive line, a magnetic stack material being disposed over and abutting the bottom electrode material, a conductive hard mask being disposed over and abutting the magnetic stack material, and wherein the conductive hard mask and the magnetic stack material have been patterned with a pattern for at least one magnetic memory cell. The method includes depositing an insulating hard mask over the patterned conductive hard mask, patterned magnetic stack material, and exposed portions of the bottom electrode material, patterning the insulating hard mask with a pattern for a bottom electrode for the at least one magnetic memory cell, and patterning the bottom electrode material with the insulating hard mask. The insulating hard mask is removed from at least a top surface of the conductive hard mask, a buffer insulating layer is deposited over the insulating hard mask, and an etch stop material is deposited over the buffer insulating layer. A first insulating layer is deposited over the etch stop material, and the first insulating layer is patterned with a pattern for a plurality of second conductive lines, stopping on the etch stop material, the second conductive lines running in a different direction from the first conductive lines, wherein the pattern for at least one of the second conductive lines is disposed over and abuts the conductive hard mask. The etch stop material is removed from a top surface of at least the conductive hard mask, leaving at least a portion of the buffer insulating layer over the top surface of the conductive hard mask.

In accordance with another preferred embodiment of the present invention, a method of fabricating an MRAM device includes providing a workpiece, forming a plurality of first conductive lines over the workpiece, wherein a first insulating layer is disposed between adjacent first conductive lines, and depositing a bottom electrode material over and abutting at least one first conductive line. A magnetic stack material is deposited over and abutting the bottom electrode material, a conductive hard mask is deposited over the magnetic stack material, and the conductive hard mask is patterned with a pattern for at least one MRAM cell. The magnetic stack material is patterned with the conductive hard mask, an insulating hard mask is deposited over the patterned conductive hard mask, patterned magnetic stack material, and exposed portions of the bottom electrode material, and the conductive hard mask is patterned with a pattern for a bottom electrode for the at least one magnetic memory cell. The bottom electrode material is patterned with the insulating hard mask, the insulating hard mask is removed from at least a top surface of the conductive hard mask, and a buffer insulating layer is deposited over the insulating hard mask. An etch stop material is deposited over the buffer insulating layer, a second insulating layer is deposited over the etch stop material, and the second insulating layer is patterned with a pattern for a plurality of second conductive lines, stopping on the etch stop material, the second conductive lines running in a different direction from the first conductive lines, wherein the pattern for at least one of the second conductive lines is disposed over and abuts the conductive hard mask. The etch stop material is removed from a top surface of at least the conductive hard mask, leaving at least a portion of the buffer insulating layer over the top surface of the conductive hard mask.

In accordance with yet another preferred embodiment of the present invention, a magnetic memory device includes a workpiece, a plurality of first conductive lines disposed over the workpiece, and a first insulating layer disposed between adjacent first conductive lines. A bottom electrode is disposed over and abuts at least one first conductive line, a magnetic stack is disposed over and abutting the bottom electrode material, and a conductive hard mask is disposed over the magnetic stack material. An insulating hard mask is disposed over portions of the bottom electrode material, a buffer insulating layer is disposed over the insulating hard mask, and an etch stop material is disposed over the buffer insulating layer. A second insulating layer is disposed over the etch stop material, and a plurality of second conductive lines are formed within the insulating layer running in a different direction from the first conductive lines, wherein at least one of the second conductive lines is disposed over and abuts the conductive hard mask.

Advantages of preferred embodiments of the present invention include providing an integration scheme for a magnetic memory device, wherein the top surface of the conductive material over the MTJ stack is covered with a buffer insulating layer while the device is exposed to plasma processing, preventing damage to the MTJ stack. An etch stop material is deposited over the buffer insulating layer, which improves the uniformity of depth of second conductive lines formed over the magnetic memory cells.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an MRAM device. The invention may also be applied, however, to other magnetic memory devices, for example. Only one magnetic memory device is shown in each figure; however, there may be many other magnetic memory devices and other electrical components in the devices shown.

Figure 1:
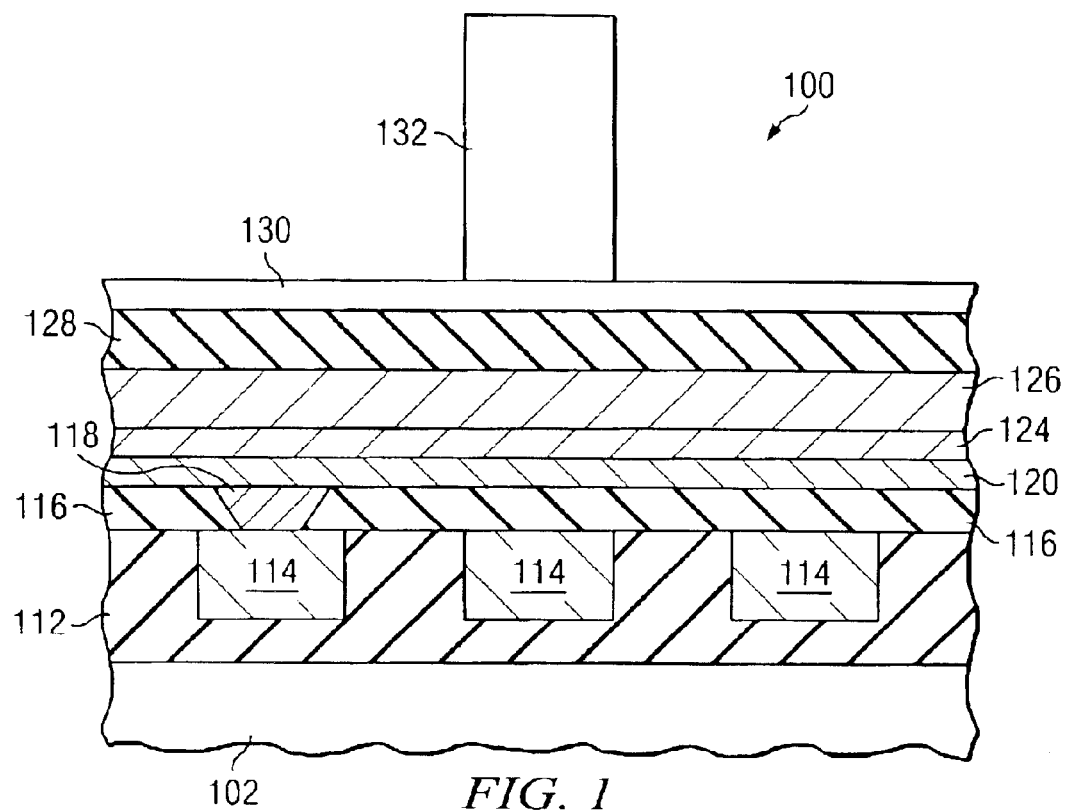
FIGS. 1 through 16 illustrate cross-sectional views of a magnetic memory device at various stages of manufacturing, in accordance with an embodiment of the present invention.

FIGS. 1 through 16 illustrate cross-sectional views of a magnetic memory device 100 at various stages of fabrication, in accordance with an embodiment of the present invention. Referring now to FIG. 1, a semiconductor wafer comprising a workpiece 102 is provided. The workpiece 102 may comprise one or more layers of a dielectric such as silicon oxide or low-k materials disposed over silicon single-crystal silicon, for example. The workpiece 102 may include other conductive layers or other semiconductor elements, such as transistors, or diodes, as examples (not shown).

A first insulating layer 112 is deposited or formed over the workpiece 102. The first insulating layer 112 may comprise an inter-level dielectric, and may comprise silicon dioxide, for example. Alternatively, the first insulating layer 112 may comprise other dielectric materials, for example. In a damascene process, the first insulating layer 112 is patterned for first conductive lines, and a conductive material is deposited over the wafer to fill the patterned first insulating layer 112 and form first conductive lines 114. Excess conductive material is removed from the top surface of the first insulating layer 112.

If the first conductive lines 114 comprise copper, the first conductive lines 114 are preferably formed in a damascene process, as described. However, alternatively, the first conductive lines 114 may be formed by the deposition of a conductive material, a patterning and etch of the conductive material, and then the deposition of a first insulating layer 112 between the first conductive lines 114, (not shown).

A second insulating layer 116 is deposited over the first conductive lines 114 and the first insulating layer 112. The second insulating layer 116 may comprise the same material as the first insulating layer 112, for example. Alternatively, the first insulating layer 112 may comprise other dielectric materials, for example. The second insulating layer 116 is patterned, and a conductive material is deposited over the second insulating layer 116 to form vias 118 in the second insulating layer 116 that make electrical contact to the first conductive lines 114. The via 118 conductive material may comprise copper, tungsten or other metals, for example. Excess conductive material is removed from the top surface of the second insulating layer 116, e.g., using a chemical-mechanical polish (CMP) process.

A bottom electrode material 120 is deposited over the second insulating layer 116 and the vias 118. The bottom electrode material 120 may comprise a first conductive layer that functions as a seed layer, and a second conductive layer that functions as a pinning layer for the MTJ stack deposited over the first conductive layer, for example. The bottom electrode material 120 first conductive material may comprise tantalum, tantalum nitride, or a bi-layer of both, as examples. The first conductive material functions as a seed layer for the second conductive material deposition, which will be described further herein. The first conductive material preferably comprises a 150 Angstrom thick layer of TaN deposited over the second insulating layer 116, and a 50 Angstrom thick layer of Ta deposited over the TaN layer. The TaN layer and Ta layer preferably range between 50 to 150 Angstroms in thickness, as examples.

The bottom electrode material 120 also comprises a second conductive material deposited over the first conductive material. The second conductive material preferably comprises PtMn, and may alternatively comprise IrMn, as examples, although the second conductive material may comprise other conductive materials. The PtMn is preferably 175 Angstroms thick, and may alternatively range from 125 to 300 Angstroms thick, for examples. The second conductive material of the bottom electrode material 120 functions as the pinning layer for the free layer of the magnetic stack material 124 that will next be deposited.

A magnetic stack material 124 is deposited over the bottom electrode material 120. The magnetic stack material 124 includes a soft layer comprising 1) a fixed layer comprising a layer of TaN, a layer of NiFe, and one or more optional additional magnetic layers; 2) a tunnel barrier or tunnel junction comprising a layer of AlO; and 3) a free layer comprising a layer of CoFe, a layer of Ru, a layer of CoFe, and optional additional magnetic layers, for example. The magnetization of the fixed layer is typically kept at a certain orientation, while the magnetization of the free layer is switched depending on the logic state of the magnetic memory cell 124.

A conductive hard mask 126 is deposited over the magnetic stack material 124. The conductive hard mask 126 is preferably conductive, and preferably comprises TiN. Alternatively, the conductive hard mask 126 may comprise TiN, Ta, TaN, a combination thereof, or other conductive materials, for example. The conductive hard mask 126 preferably comprises a thickness of 1500 Angstroms, as an example.

An optional oxide hard mask 128 may be deposited over the conductive hard mask 126. The oxide hard mask 128 preferably comprises silicon dioxide deposited at a temperature of 350 degrees C. or lower in a thickness of approximately 500 to 1500 Angstroms, for example. The optional oxide hard mask 128 provides increased selectivity during the patterning of the magnetic stack material 124.

Next, an antireflective coating (ARC) 130 is deposited over the conductive hard mask 126 or oxide hard mask 128, as shown in FIG. 1. A photoresist 132 is deposited over the ARC 130. The photoresist 132 may comprise 625 nm photoresist, for example. The photoresist 132 is patterned using traditional lithography with the pattern for at least one magnetic memory cell.

Figure 2:
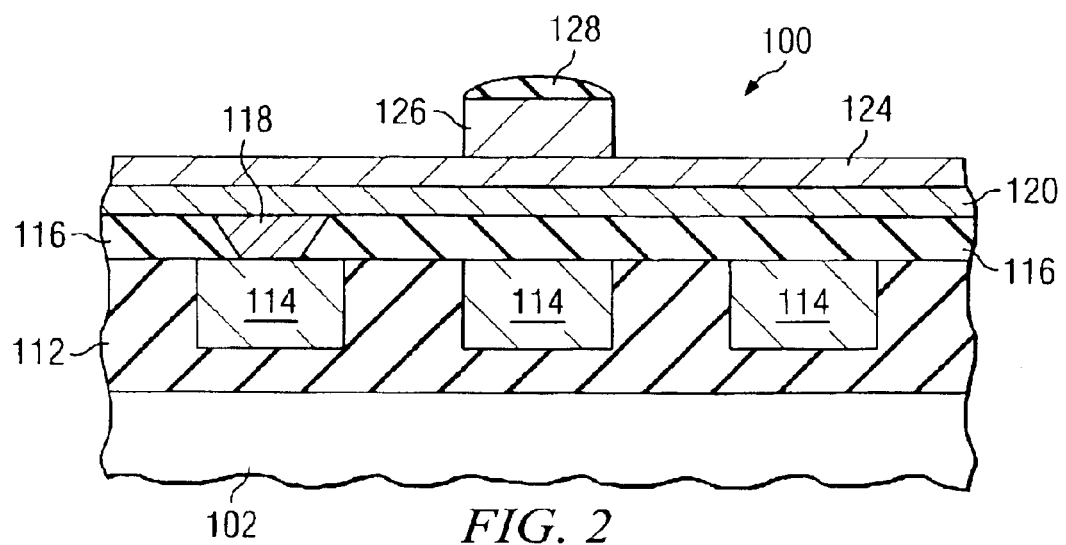

After an ARC 130 open step, the oxide hard mask 128 and conductive hard mask 126 are patterned using the photoresist 132 as a mask, using a reactive ion etch (RIE), for example, as shown in FIG. 2. The photoresist 132 is then stripped, or removed from the workpiece 102. If the optional oxide hard mask 128 is used, a portion of the oxide hard mask 128 may be left residing over the top surface of the conductive hard mask 126 after the photoresist 132 is stripped, as shown.

Figure 3:
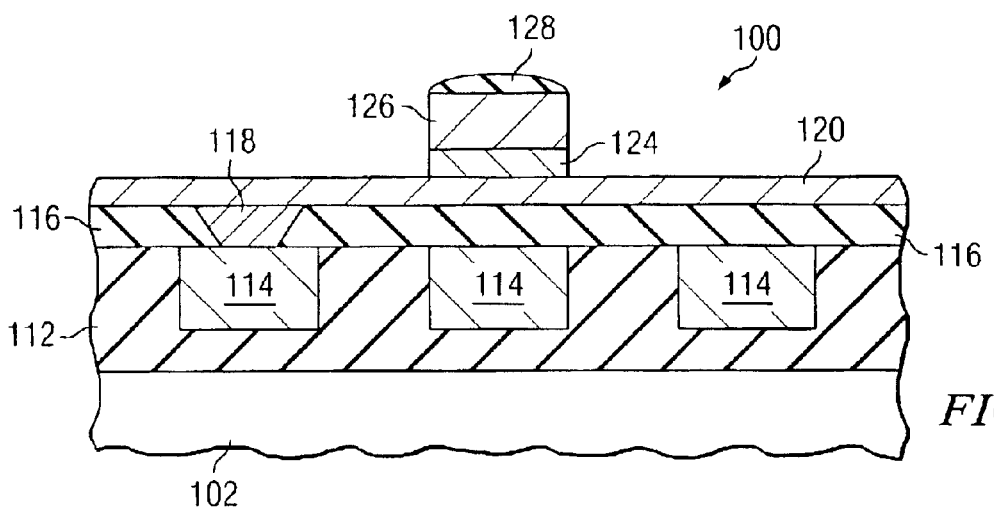

After the photoresist 132 is removed, the magnetic stack material 124 is patterned using the conductive hard mask 126 and optional oxide hard mask 128 as a mask to transfer the at least one magnetic memory cell pattern to the magnetic stack material 124, as shown in FIG. 3. If the optional oxide hard mask 128 is used, a portion of the oxide hard mask 128 may be left residing over the top surface of the conductive hard mask 126 after the magnetic stack material 124 is patterned, as shown.

Figure 4:
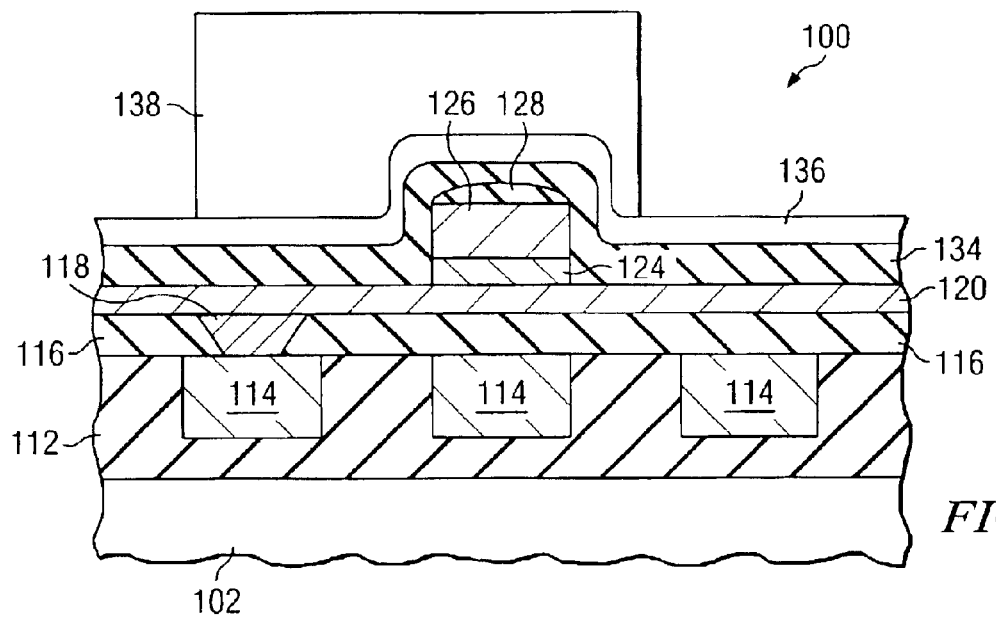
Figure 5:
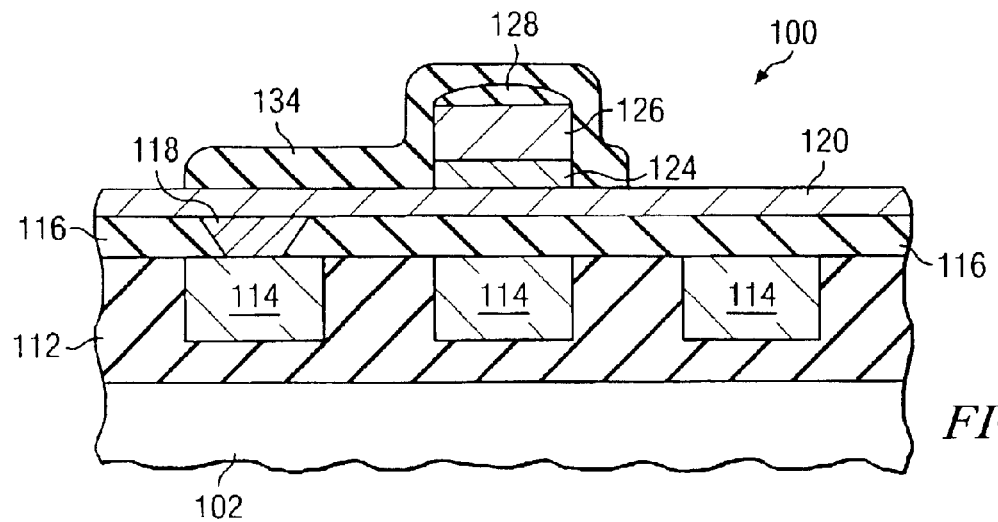

An insulating hard mask 134 is deposited over the patterned conductive hard mask 126, patterned magnetic stack material 124, and exposed portions of the bottom electrode material 120, as shown in FIG. 4. The insulating hard mask 134 preferably comprises silicon nitride and may alternatively comprise silicon dioxide, for example. The insulating hard mask 134 may comprise a thickness of approximately 1000 Angstroms, for example.

An ARC 136 may be deposited over the insulating hard mask 134. A photoresist 138 is deposited over the ARC 136. The photoresist 138 may comprise 625 nm photoresist, for example. The photoresist 138 is patterned using traditional lithography with the pattern for a bottom electrode for the at least one magnetic memory cell, as shown in FIG. 4.

After an ARC 136 open step, the insulating hard mask 134 is patterned with the bottom electrode pattern using the photoresist 138 as a mask, using a RIE process, for example. The photoresist 138 and ARC 136 are then removed from the workpiece 102, leaving the structure shown in FIG. 5.

Figure 6:
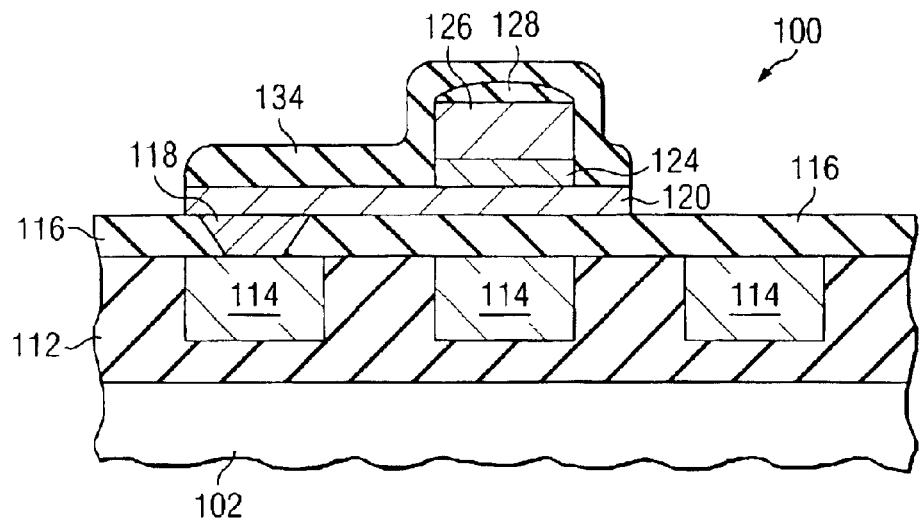

The bottom electrode material 120 is patterned using the insulating hard mask 134 as a mask, as shown in FIG. 6. The bottom electrode material 120 electrically couples the bottom of the MTJ stack 124 to the via 118 and underlying first conductive line 114, as shown.

Figure 7:
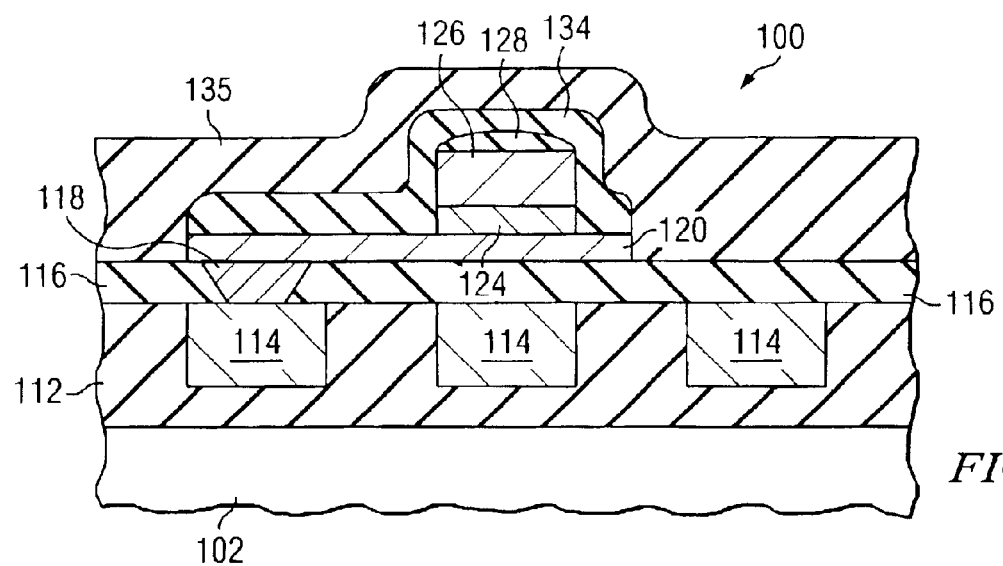

A third insulating layer 135 is deposited over the patterned insulating hard mask 134, as shown in FIG. 7. The third insulating layer 135 may comprise a dielectric fill to electrically isolate the patterned magnetic stack material 126 which form the magnetic memory cells. The third insulating layer 135 may comprise an overfill, as shown. The third insulating layer 135 may comprise silicon dioxide, deposited by low temperature tetraethoxysilate (TEOS) or chemical vapor deposition (CVD) TEOS, although alternatively, the third insulating layer 135 may comprise other dielectric materials, for example.

Figure 8:
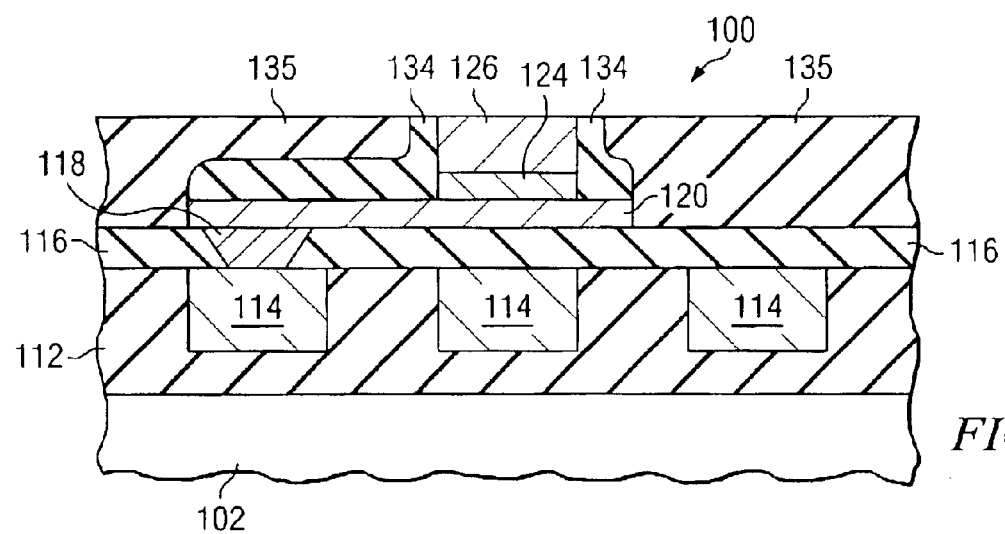

Next, the workpiece 102 is exposed to a planarization process, such as a CMP process step, to remove the third insulating layer 135 and optional oxide hard mask 128 from the top surface of the conductive hard mask 126, exposing the top surface of the conductive hard mask 126, as shown in FIG. 8. The CMP process is preferably designed to stop on the conductive hard mask 126, for example. The top surface of the third insulating layer 135 is preferably coplanar with the top surface of the conductive hard mask 126, as shown.

Figure 9:
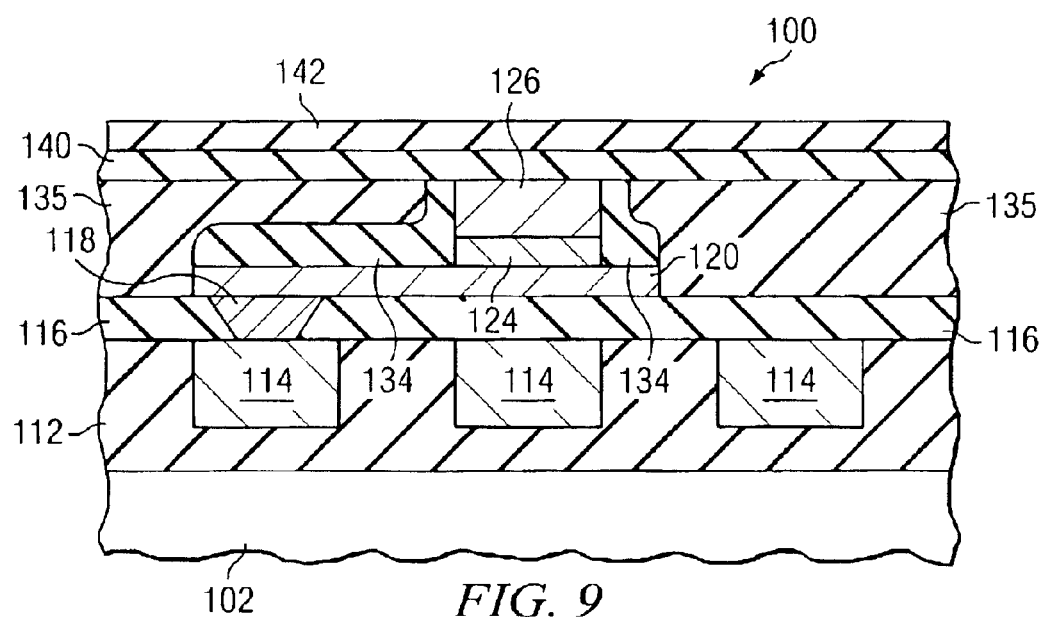

A buffer insulating layer 140 is deposited over the conductive hard mask 126 and third insulating layer 135, as shown in FIG. 9. The buffer insulating layer 140 preferably comprises approximately 100 to 300 Angstroms of an oxide such as silicon dioxide, although alternatively, other dielectric materials may be used.

An etch stop material 142 is deposited over the buffer insulating layer 140, as shown in FIG. 9. The etch stop material 142 preferably comprises silicon nitride ($Si_xN_y$), although alternatively, the etch stop material 143 may comprise other dielectric materials, for example. The etch stop material 142 is preferably deposited in a thickness of 300 to 500 Angstroms, for example.

Figure 10:
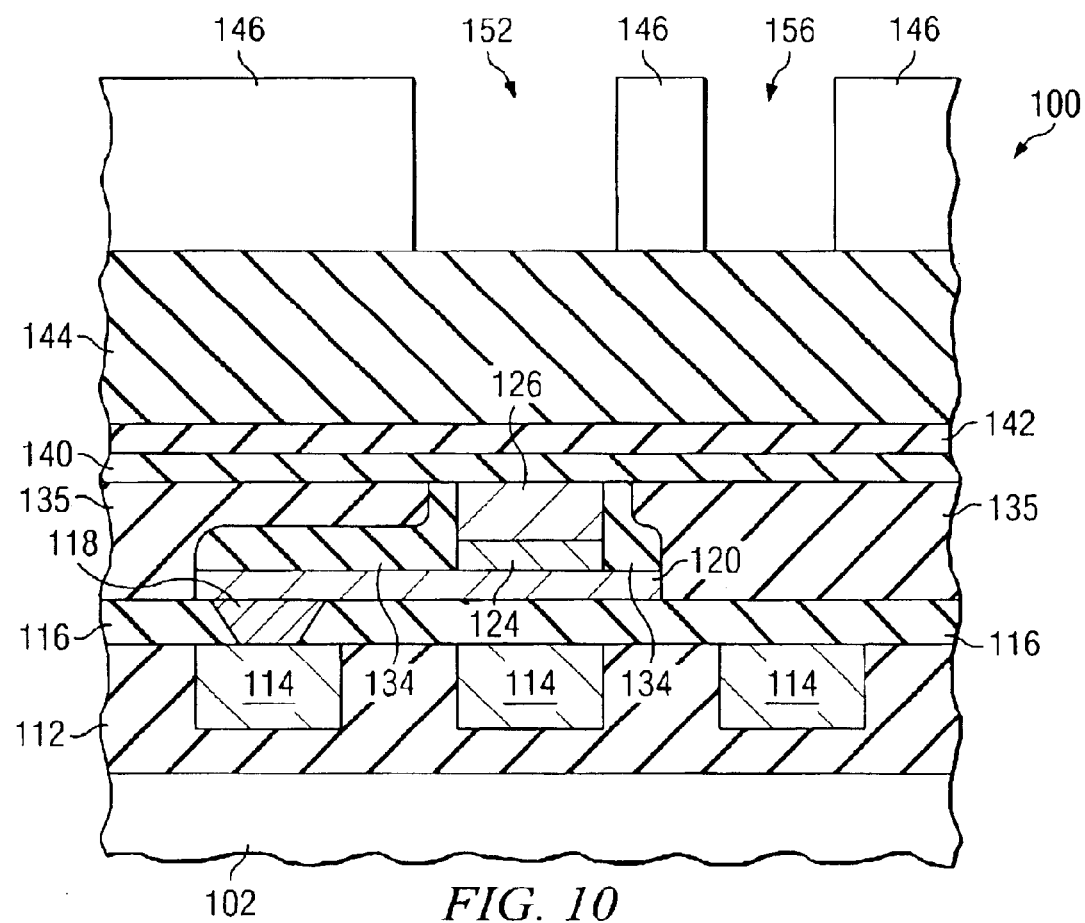

A fourth insulating layer 144 is deposited over the etch stop material 142, as shown in FIG. 10. The fourth insulating layer 144 may comprise silicon dioxide, deposited by low temperature TEOS deposited at approximately 300 degrees C. or CVD TEOS, although alternatively, the fourth insulating layer 144 may comprise other dielectric materials, for example. The fourth insulating layer 144 may comprise a thickness of approximately 4500 Angstroms, for example.

A first damascene process is used to pattern second conductive lines in the fourth insulating layer 144. A photoresist 146 is deposited over the fourth insulating layer 144, as shown in FIG. 10. The photoresist 146 is patterned using lithography with the pattern 152 for second conductive lines that will be formed over the conductive hard mask 126. The pattern 152 for the second conductive lines run in a different direction, e.g., substantially perpendicular, from the first conductive lines 114. A pattern 156 for vias may also be formed in the photoresist 146, as shown.

Figure 11:
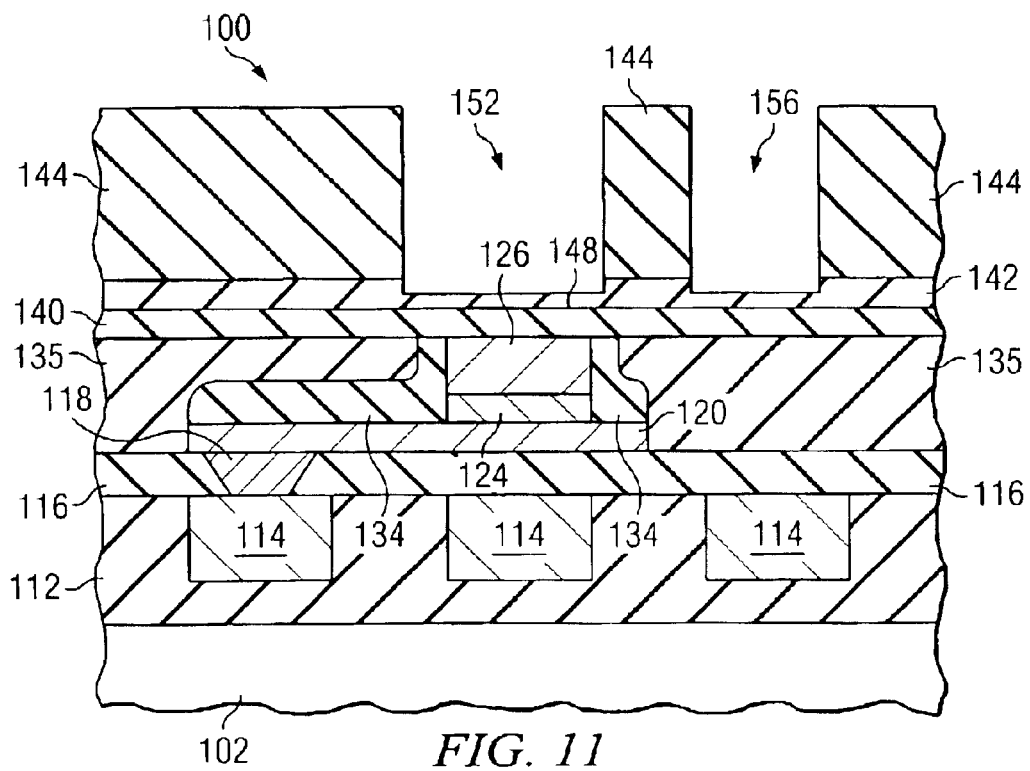

The second conductive line pattern 152 and via pattern 156 are transferred from the photoresist 146 to the fourth insulating layer 144 using a RIE process, for example, using the etch stop material 142 as an etch stop, as shown in FIG. 11. A top portion, e.g. several Angstroms, of the etch stop material 142 may be removed during the patterning of the fourth insulating layer, for example.

The photoresist 146 is removed from the top surface of the fourth insulating layer 144, as shown in FIG. 11. Advantageously, in accordance with an embodiment of the present invention, due to the presence of the etch stop material 142 and buffer insulating layer 140, the top surface of the conductive hard mask 126 is not exposed to the etch chemistries of the photoresist 146 strip process, which may contain oxygen plasma.

Figure 12:
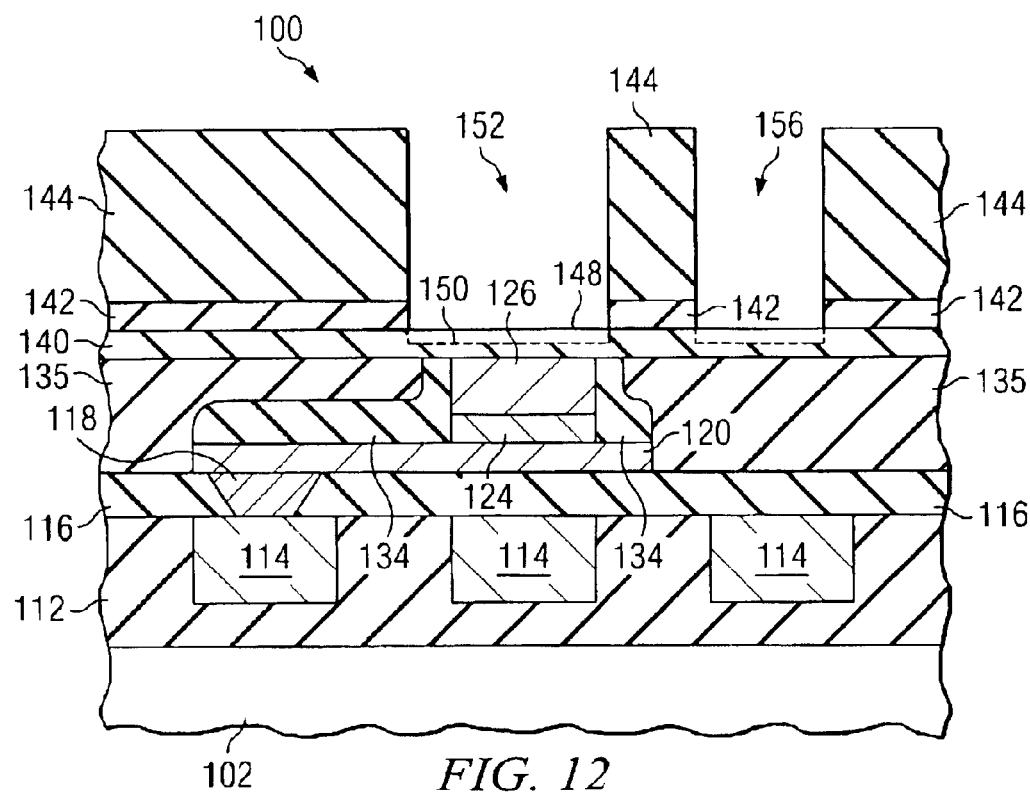

Next, the etch stop material 142 is removed from over the buffer insulating layer 140, as shown in FIG. 12. The etch stop material 142 may be removed using a timed etch or a using an endpoint etch process, for example. Preferably, in accordance with an embodiment of the present invention, a portion of the buffer insulating layer 140 remains residing over the top surface of the conductive hard mask 126 after the removal of the etch stop material 142. For example, preferably at least 50 Angstroms of the buffer insulating layer 140 material remains over the conductive hard mask 126 top surface, and more preferably, approximately 50 to 200 Angstroms of buffer insulating layer 140 material remain over the conductive hard mask 126 top surface after the removal of the etch stop material 142. The buffer insulating layer 140 has a top surface 148 prior to the removal of the etch stop material 142, which top surface is lowered to a level 150 after the removal of the etch stop material 142, for example.

Because a portion of the buffer insulating layer 140 is left residing over the top surface of the conductive hard mask 126 when the etch stop material 142 is removed, advantageously, the top surface of the conductive hard mask 126 is not exposed to the etch chemistries used to remove the etch stop material 142, which may contain plasma.

Figure 13:
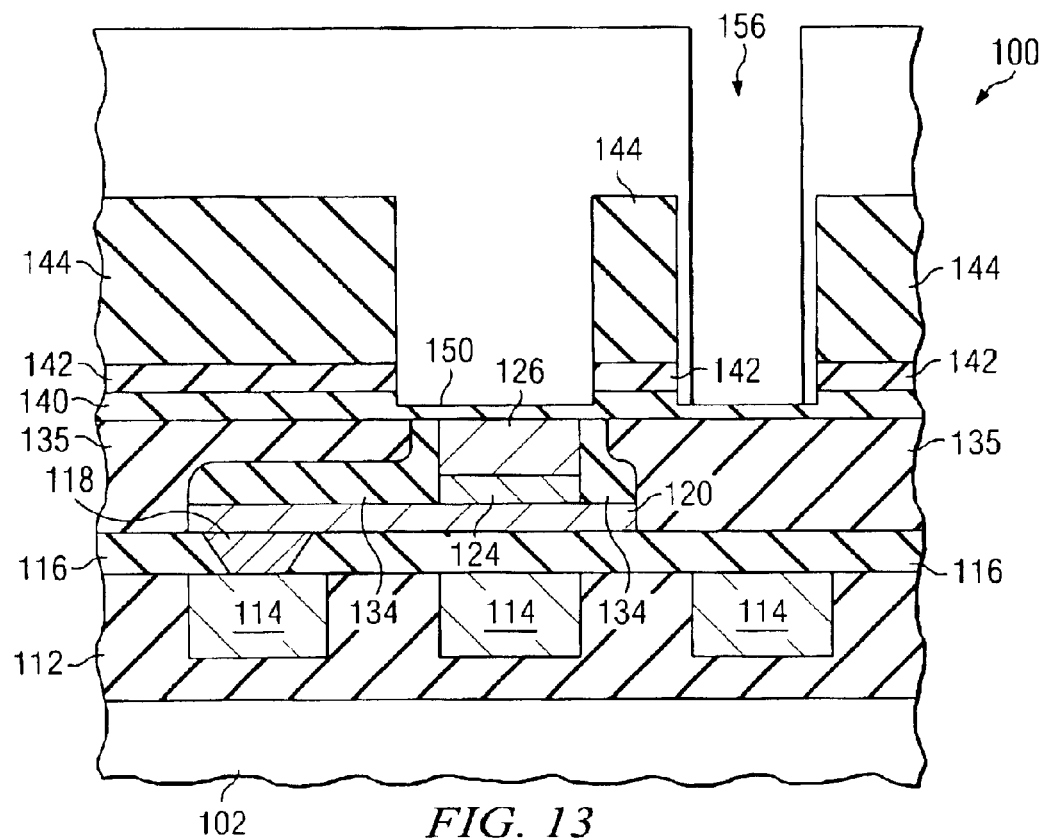
Figure 14:
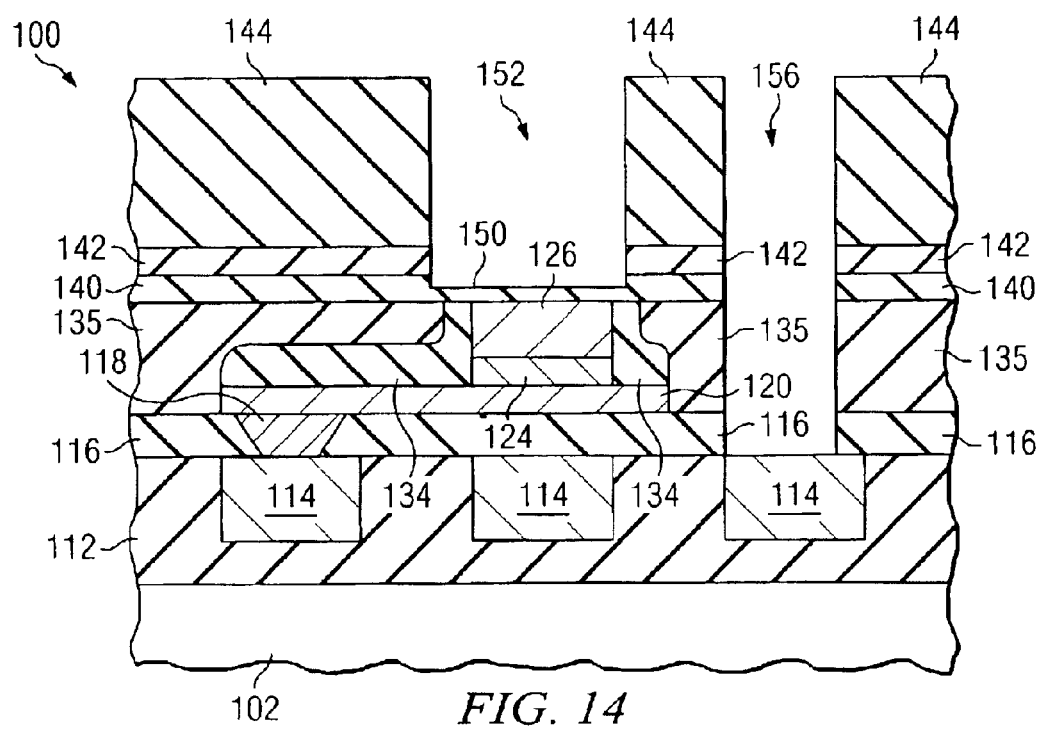

Next, an optional second damascene process may be used to form vias 156 in the underlying layers 140, 135, and 116. A photoresist 154 is deposited over the fourth insulating layer 144, as shown in FIG. 13. The photoresist 154 is patterned with the pattern for at least one via 156, and the photoresist 154 is then used as a mask to pattern the buffer insulating layer 140, third insulating layer 135, and second insulating layer 116, forming a pattern 156 for a via, while the photoresist 154 is left remaining over the top surface of the fourth insulating layer 144, as shown in FIG. 14. The photoresist 154 is then removed. Advantageously, the buffer insulating layer 140 protects the top surface of the conductive hard mask 126 during the photoresist 154 strip process, which may contain oxygen plasma, for example.

Figure 15:
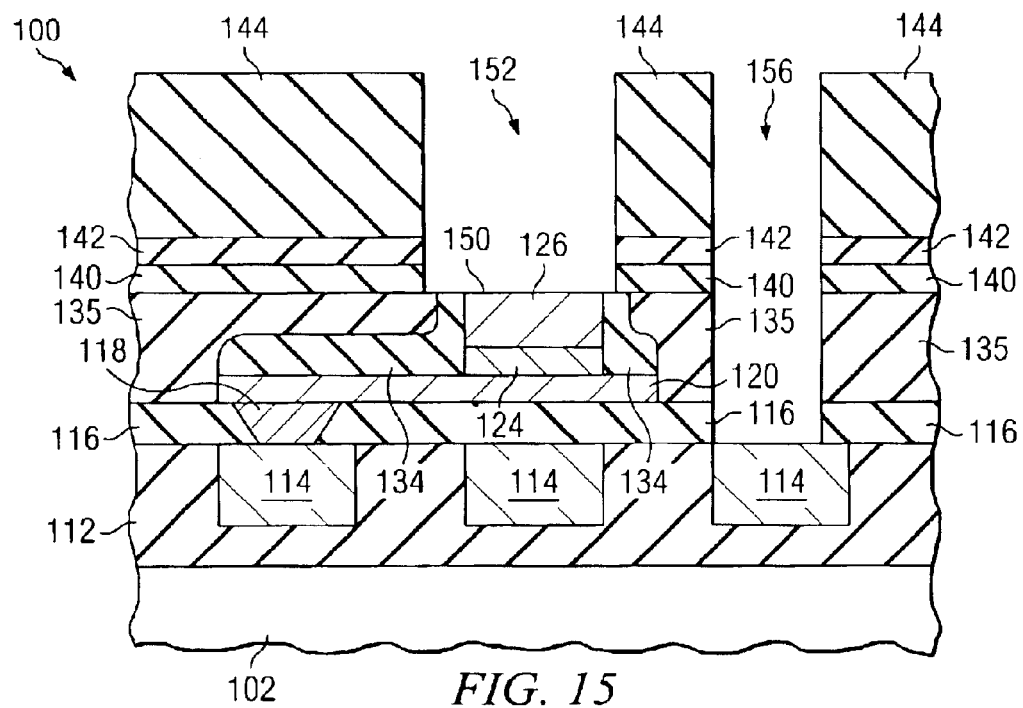

Remaining portions of the buffer insulating layer 140 are then removed from over the conductive hard mask 126, as shown in FIG. 15. The etch process to remove the buffer insulating layer 140 preferably comprise a non-plasma process to avoid damage to the top surface of the conductive hard mask 126, in accordance with an embodiment of the present invention. For example, the etch process to remove the buffer insulating layer 140 may comprise a wet etch or other etch process that does not contain plasma.

Figure 16:
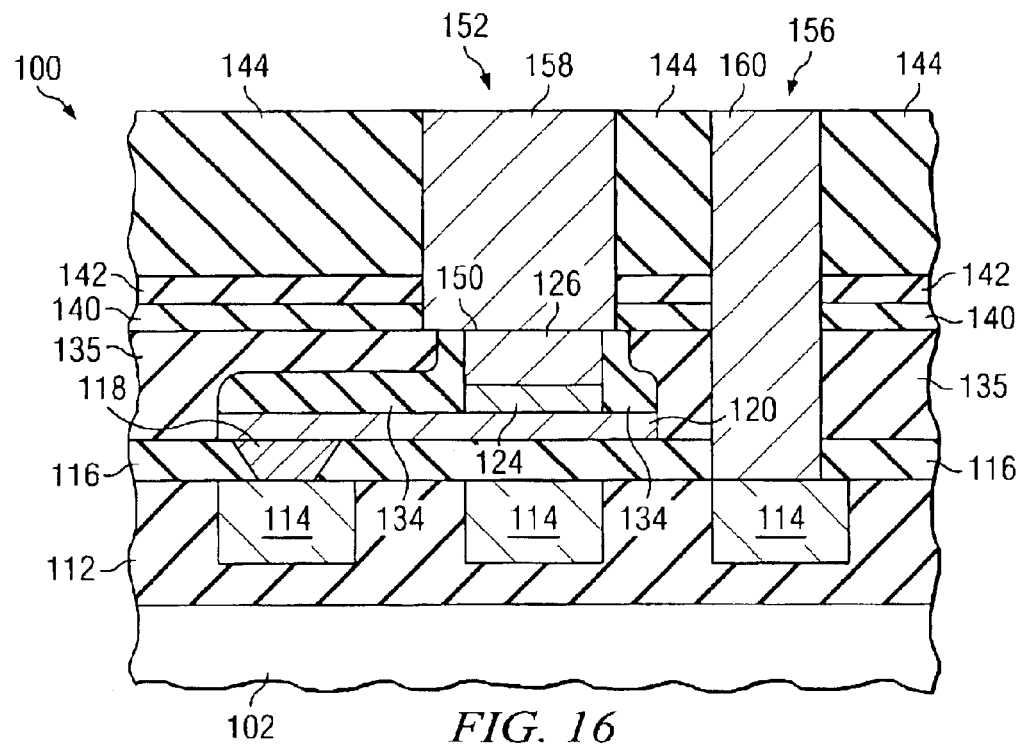

Next, the via trenches 156 and second conductive line trenches 152 are filled with a conductive material to form second conductive lines 158 and vias 160 to make connections to underlying conductive lines 114, as shown in FIG. 16. In this fill process, which may comprise a damascene or dual damascene process, for example, a liner (not shown) may first be deposited over the fourth insulating layer 144, and then a conductive material may be deposited over the liner. The workpiece 102 is then exposed to a CMP process to remove the excess conductive material and liner from over the top surface of the fourth insulating layer 144, forming second conductive lines 158 and vias 160, as shown in FIG. 16. Subsequent processing is then performed on the workpiece 102 to complete the manufacturing of the magnetic memory device 100.

In one embodiment of the present invention, a dual damascene process for forming second conductive lines 158 and vias 160 comprises patterning the fourth insulating layer 144 with the via pattern 156 after patterning at least the buffer insulating layer 140 with the pattern 152 for a plurality of second conductive lines, as shown in FIGS. 12 through 14.

In yet another embodiment of the present invention, the vias are patterned before the second conductive lines. In this embodiment, the fourth insulating layer 144 is first patterned with the via pattern 156 (not shown in the Figures). A photoresist is deposited over the fourth insulating layer 144, and the photoresist is patterned with the via pattern 156. The photoresist is used as a mask to pattern the fourth insulating layer 144, the etch stop material 142, the buffer insulating layer 140, the third insulating layer 135, and the second insulating layer with the via pattern 156, exposing the top surface of at least one first conductive line 114, for example. Next, photoresist is deposited over the fourth insulating layer 114, wherein the photoresist at least partially fills the via pattern 156, for example. The photoresist is patterned with the second conductive line pattern 152. The photoresist is used as a mask to pattern the fourth insulating layer 144 and the etch stop layer 142 with the second conductive line pattern 152.

The photoresist is then removed. Advantageously, the buffer insulating layer 140 protects the top surface of the conductive hard mask 126 during the photoresist strip process, which may contain oxygen plasma, for example. Remaining portions of the buffer insulating layer 140 are then removed from over the conductive hard mask 126, wherein the etch process to remove the buffer insulating layer 140 preferably comprise a non-plasma process to avoid damage to the top surface of the conductive hard mask 126. A conductive material is then deposited over the patterned fourth insulating layer 144, and the top surface of the fourth insulating layer 144 is planarized to remove excess portions of the conductive material, leaving second conductive lines 158 and vias 160 formed within the fourth insulating layer 144, as shown in FIG. 16.

Advantages of embodiments of the invention include providing a novel integration scheme that avoids plasma damage to magnetic memory cells 124. The buffer insulating layer 140 is left residing over the conductive hard mask 126 and the magnetic memory cells 124 during etch processes and photoresist removal processes that contain plasma, preventing damage to the top surface of the conductive hard mask 126 and magnetic memory cell materials 124. This is advantageous in that a more reliable, higher performance magnetic memory device 100 may be manufactured. Because the top surface of the conductive hard mask 126 is not exposed to plasma, electric current is not caused to flow through the magnetic memory cell 124, which can cause damage to a tunnel junction of a magnetic memory cell. In addition, the etch stop material 142 over the buffer insulating layer 140 improves the depth uniformity of the second conductive lines 158 over the magnetic memory cells 124.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. The various insulating material layers are numbered in order of their introduction in the claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a magnetic memory device, comprising:

providing a workpiece having a plurality of first conductive lines formed thereon, a bottom electrode material being disposed over and abutting at least one first conductive line, a magnetic stack material being disposed over and abutting the bottom electrode material, a conductive hard mask being disposed over and abutting the magnetic stack material, wherein the conductive hard mask and the magnetic stack material have been patterned with a pattern for at least one magnetic memory cell;

depositing an insulting hard mask over the patterned conductive hard mask, patterned magnetic stack material, and exposed portion of the bottom electrode material;

patterning the insulating hard mask with a pattern for a bottom electrode for the at least one magnetic memory cell;

patterning the bottom electrode material with the insulating hard mask;

removing the insulating hard mask from at least a top surface of the conductive hard mask;

depositing a buffer insulating layer over this insulating hard mask;

depositing an etch stop material over the buffer insulating layer;

depositing a first insulating layer over the etch stop material;

patterning the first insulating layer with a pattern for a plurality of second conductive lines, stopping on the etch stop material, the second conductive lines running in a different direction from the first conductive lines, wherein the pattern for at least one of the second conductive lines is disposed over and abuts the conductive hard mask; and removing the etch stop material from a top surface of at least the conductive hard mask, leaving at least a portion of the buffer insulating layer over the top surface of the conductive hard mask.

2. The method according to claim 1, wherein depositing the buffer insulating layer comprises depositing silicon dioxide.

3. The method according to claim 2, wherein depositing the buffer insulating layer comprises depositing approximately 100 to 300 Angstroms of material.

4. The method according to claim 3, wherein removing the etch stop material from the top surface of at least the conductive hard mask comprises leaving approximately 50 to 200 Angstroms of the buffer insulating layer over the top surface of the conductive hard mask.

5. The method according to claim 1, wherein removing the etch stop material or patterning the first insulating layer comprise a plasma etch process, wherein the buffer insulating layer protects the top surface of the conductive hard mask while removing the etch stop material or patterning the first insulating layer.

6. The method according to claim 1, further comprising:
depositing a photoresist over the first insulating layer;
patterning the photoresist with a pattern for at least one via;
patterning at least the buffer insulating layer with the via pattern using the photoresist as a mask;
removing the photoresist; and
removing the buffer insulating layer from the top surface of the conductive hard mask.

7. The method according to claim 6, wherein the buffer insulating layer protects the top surface of the conductive hard mask while removing the photoresist.

8. The method according to claim 6, wherein patterning at least the buffer insulating layer with the via pattern occurs before patterning the first insulating layer with the pattern for a plurality of second conductive lines, or wherein patterning at least the buffer insulating layer with the via pattern occurs after patterning the first insulating layer with the pattern for a plurality of second conductive lines.

9. The method according to claim 8, further comprising:
depositing a conductive material over the pattern first insulating layer; and
planarizing the first insulating layer to from a plurality of second conductive lines and at least one via in the first insulating layer.

10. The method according to claim 1, wherein forming at least one magnetic memory cell comprises forming a magnetic random access memory (MRAM) cell.

11. The method according to claim 1, wherein depositing a conductive hard mask comprises depositing TiN, Ta or TaN, wherein depositing the etch stop material comprises depositing $Si_xN_y$, and wherein depositing the buffer insulating layer comprises depositing $SiO_2$.

12. The method according claim 1, further comprising, after patterning the bottom electrode material with the insulating hard mask depositing a second insulating layer over the insulating hard mask, wherein removing the insulating hard mask from at least a top surface of the conductive hard mask includes removing the second insulating layer from the top surface of the conductive hard mask.

13. A method of fabricating a magnetic random access memory (MRAM) device, comprising:
providing a workpiece;
forming a plurality of first conductive lines over the workpiece, wherein a first insulating layer is disposed between adjacent first conductive lines;
depositing a bottom electrode material over and abutting at least one first conductive line;
depositing a magnetic stack material over and abutting the bottom electrode material;
depositing a conductive hard mask over the magnetic stack material;
patterning the conductive hard mask with a pattern for at least one MRAM cell;
patterning the magnetic stack material with the conductive hard mask;
depositing an insulating hard mask over the patterned conductive hard mask, patterned magnetic stack material, and exposed portions of the bottom electrode material;
patterning the insulative hard mask with a pattern for a bottom electrode for at least one magnetic memory cell;
patterning the bottom electrode material with the insulating hard mask;
removing the insulating hard mask from at least a top surface of the conductive hard mask
depositing a buffer insulating layer over the insulating hard mask;
depositing an etch stop material over the buffer insulating layer;
depositing a second insulating layer over the etch stop material;
patterning the second insulating layer with a pattern for a plurality of second conductive lines, stopping on the etch stop material, the second conductive lines running in a different direction from the first conductive lines, wherein the pattern for at least one of the second conductive lines is disposed over and abuts the conductive hard mask; and
removing the etch stop material from a top surface at least the conductive hard mask, leaving at least a portion of the buffer insulating layer over the top surface of the conductive hard mask.

14. The method according claim 13, wherein depositing the buffer insulating layer comprises depositing silicon dioxide.

15. The method according claim 14, wherein depositing the buffer insulating layer comprises depositing approximately 100 to 300 Angstroms of material.

16. The method according claim 15, wherein removing the etch stop material from the top surface of at least the conductive hard mask comprises leaving approximately 50 to 200 Angstroms of the buffer insulating layer over the top surface of the conductive hard mask.

17. The method according claim 13, wherein removing the etch stop material or patterning the second insulating layer comprise a plasma etch process, wherein the buffer insulating layer protects the top surface of the conductive hard mask while removing the etch stop material or patterning the second insulating layer.

18. The method according claim 13, further comprising, after patterning the bottom electrode material with the insulating hard mask, depositing a third insulating layer over the insulating hard mask, wherein removing the insulating hard mask from at least a top surface of the conductive hard mask includes removing the third insulating layer from the top surface of the conductive hard mask.

19. The method according claim 13, further comprising:
depositing a photoresist over the second insulating layer;
patterning the photoresist with a pattern for at least one via;
patterning at least the buffer insulating layer with the via pattern using the photoresist as a mask;
removing the photoresist; and
removing the buffer insulating layer from the top surface of the conductive hard mask.

20. The method according claim 19, wherein the buffer insulating layer protects the top surface of the conductive hard mask while removing the photoresist.

21. The method according claim 19, wherein patterning at least the buffer insulating layer with the via pattern occurs before patterning the second insulating layer with the pattern for a plurality of second conductive lines, or wherein patterning at least the buffer insulating layer with the via pattern occurs after patterning the second insulating layer with the pattern for a plurality of second conductive lines.

22. The method according claim 19, further comprising:
depositing a conductive material over the patterned second insulating layer, and planarizing the second insulating layer to from a plurality of second conductive lines and at least one via in the second insulating layer.

23. The method according claim 13, wherein depositing the conduct hard mask comprises depositing TiN, Ta or TaN, wherein depositing the etch stop material comprises depositing $Si_xN_y$, and wherein depositing the buffer insulating layer comprises depositing $SiO_2$.

* * * * *

UNITED STATES PATENT AND TRADEMARK OFFICE
CERTIFICATE OF CORRECTION

PATENT NO. : 6,806,096 B1
DATED : October 19, 2004
INVENTOR(S) : Kim et al.

It is certified that error appears in the above-identified patent and that said Letters Patent is hereby corrected as shown below:

Column 1,
Line 64, delete "crosspoint" and insert -- cross-point --.

Column 10,
Line 26, delete "portion" and insert -- portions --.
Line 35, delete "this" and insert -- the --.

Column 11,
Line 24, delete "pattern" and insert -- patterned --.
Line 26, delete "from" and insert -- form --.
Line 37, insert -- to -- after "according".
Line 39, delete "mask" and insert -- mask, --.
Line 67, insert -- the -- after "for".

Column 12,
Line 18, insert -- of -- after "surface."
Lines 22, 24, 27, 32, 38, 45, 55, 58 and 65, insert -- to -- after "according".
Line 67, delete "layer," and insert -- layer; --.

Column 13,
Line 1, delete "from" and insert -- form --.
Line 4, insert -- to -- after "according".
Line 5, delete "conduct" and insert -- conductive --.

Signed and Sealed this

First Day of February, 2005

JON W. DUDAS
*Director of the United States Patent and Trademark Office*